US011696477B2

(12) United States Patent
Park et al.

(10) Patent No.: US 11,696,477 B2
(45) Date of Patent: Jul. 4, 2023

(54) ORGANIC LIGHT EMITTING DIODE DISPLAY INCLUDING A COMMON POWER SUPPLY LINE IN A NON-DISPLAY AREA

(71) Applicant: Samsung Display Co., Ltd., Yongin-si (KR)

(72) Inventors: Kyong Tae Park, Suwon-si (KR); Sung Ho Cho, Yongin-si (KR); Seong Yeun Kang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/401,094

(22) Filed: Aug. 12, 2021

(65) Prior Publication Data

US 2021/0376052 A1 Dec. 2, 2021

Related U.S. Application Data

(62) Division of application No. 16/171,162, filed on Oct. 25, 2018, now Pat. No. 11,107,877.

(30) Foreign Application Priority Data

Nov. 29, 2017 (KR) .......................... 10-2017-0161936

(51) Int. Cl.
*H10K 59/131* (2023.01)
*H10K 59/124* (2023.01)
*H01L 27/12* (2006.01)
*H10K 50/87* (2023.01)
*H10K 50/842* (2023.01)
*H10K 59/121* (2023.01)
*H10K 50/844* (2023.01)
*H10K 50/84* (2023.01)

(52) U.S. Cl.
CPC ....... *H10K 59/1315* (2023.02); *H10K 59/124* (2023.02); *H10K 59/131* (2023.02);
(Continued)

(58) Field of Classification Search
CPC ............ H01L 27/3279; H01L 27/3258; H01L 27/3276; H01L 27/124; H01L 27/3262;
(Continued)

(56) References Cited

U.S. PATENT DOCUMENTS 7,619,258 B2 11/2009 Tsuchiya et al.
7,764,012 B2 7/2010 Yamazaki et al.
(Continued)

FOREIGN PATENT DOCUMENTS

JP 2007-147814 A 6/2007
JP 2011-40413 2/2011
(Continued)

OTHER PUBLICATIONS

Korean Notice of Allowance dated Oct. 21, 2022 issued in corresponding KR Application No. 10-2017-0161936 (1 page).

*Primary Examiner* — Patricia D Valenzuela
(74) *Attorney, Agent, or Firm* — Lewis Roca Rothgerber Christie LLP

(57) ABSTRACT

An organic light emitting diode display includes: a substrate including a display area and a non-display area adjacent to the display area; a pixel thin film transistor positioned in the display area of the substrate; a first data wire positioned on the pixel thin film transistor; a second data wire positioned on the first data wire; an organic light emitting element positioned on the second data wire and electrically connected to the pixel thin film transistor through the first data wire and the second data wire; a circuit unit positioned in the non-display area of the substrate and including a circuit thin film transistor electrically connected to the pixel thin film transistor; and a common power supply line overlapping at least part of the circuit unit, electrically connected to the organic light emitting element, and formed on a same layer as the second data wire.

14 Claims, 5 Drawing Sheets

(52) U.S. Cl.
CPC .......... *H01L 27/124* (2013.01); *H10K 50/841* (2023.02); *H10K 50/844* (2023.02); *H10K 50/8426* (2023.02); *H10K 50/87* (2023.02); *H10K 59/1213* (2023.02)

(58) Field of Classification Search
CPC ............... H01L 51/5246; H01L 51/529; H01L 51/5237; H10K 59/1315; H10K 59/124; H10K 59/131; H10K 50/8426; H10K 50/87; H10K 59/1213; H10K 50/84; H10K 50/841; H10K 50/844
See application file for complete search history.

(56) References Cited

U.S. PATENT DOCUMENTS

| | | |
|---|---|---|
| 9,147,721 B2 | 9/2015 | Hong |
| 9,231,000 B2 | 1/2016 | Ko et al. |
| 9,455,419 B2 | 9/2016 | Hong |
| 9,882,163 B2 | 1/2018 | Park |
| 2002/0104995 A1* | 8/2002 | Yamazaki ............ H01L 27/124 257/E27.113 |
| 2004/0012329 A1 | 1/2004 | Kobayashi |
| 2014/0292622 A1 | 10/2014 | Lee |
| 2015/0372253 A1* | 12/2015 | Hong .................. H01L 51/5253 257/40 |

FOREIGN PATENT DOCUMENTS

| | | |
|---|---|---|
| JP | 2015-141816 A | 8/2015 |
| JP | 2015-179675 | 10/2015 |
| KR | 10-2012-0003536 A | 1/2012 |
| KR | 10-2014-0108023 A | 9/2014 |
| KR | 10-2015-0049141 | 5/2015 |
| KR | 10-2016-0043226 A | 4/2016 |
| KR | 10-2016-0084949 A | 7/2016 |
| KR | 10-2016-0089016 A | 7/2016 |
| KR | 10-2016-0149384 A | 12/2016 |

* cited by examiner

ORGANIC LIGHT EMITTING DIODE DISPLAY INCLUDING A COMMON POWER SUPPLY LINE IN A NON-DISPLAY AREA

CROSS-REFERENCE TO RELATED APPLICATIONS

This application is a divisional of U.S. patent application Ser. No. 16/171,162, filed Oct. 25, 2018, which claims priority to and the benefit of Korean Patent Application No. 10-2017-0161936, filed Nov. 29, 2017, the entire content of both of which is incorporated herein by reference.

BACKGROUND

1. Field

Aspects of embodiments of the present disclosure relate to an organic light emitting diode display.

2. Description of the Related Art

Generally, as examples of display devices, there are an organic light emitting diode (OLED) display, a liquid crystal display (LCD), and a plasma display panel (PDP).

Among them, the organic light emitting diode display includes a thin film transistor and an organic light emitting element positioned at a display area of a substrate, and a circuit unit and a common power supply line positioned at a non-display area of the substrate.

The circuit unit of the non-display area is electrically connected to the thin film transistor of the display area, and the common power supply line of the non-display area is electrically connected to the organic light emitting element of the display area.

The above information disclosed in this Background section is provided for enhancement of understanding of the background of the invention and, therefore, it may contain information that does not form the prior art that is already known in this country to a person of ordinary skill in the art.

SUMMARY

According to an aspect of exemplary embodiments, in an organic light emitting diode display, a width of a non-display area is minimized or reduced.

According to an aspect of exemplary embodiments, in an organic light emitting diode display, internal contamination may be suppressed.

According to one or more embodiments, an organic light emitting diode display includes: a substrate including a display area and a non-display area adjacent to the display area; a pixel thin film transistor positioned in the display area of the substrate; a first data wire positioned on the pixel thin film transistor; a second data wire positioned on the first data wire; an organic light emitting element positioned on the second data wire and electrically connected to the pixel thin film transistor through the first data wire and the second data wire; a circuit unit positioned in the non-display area of the substrate and including a circuit thin film transistor electrically connected to the pixel thin film transistor; and a common power supply line overlapping at least part of the circuit unit, electrically connected to the organic light emitting element, and formed on a same layer as the second data wire.

The non-display area may include: a circuit area adjacent to the display area, and including the circuit unit and the common power supply line; and a sealing area adjacent to the circuit area, and the organic light emitting diode display may further include a sealing part positioned in the sealing area.

The organic light emitting diode display may further include a heat reflection part in contact with the sealing part between the sealing part and the substrate.

The heat reflection part may not be in contact with the common power supply line or the circuit unit.

The heat reflection part may be positioned on the same layer as the second data wire.

The heat reflection part may be formed on a same layer as the first data wire.

The heat reflection part may include a same material as the second data wire.

The heat reflection part may include a same material as the first data wire.

The pixel thin film transistor may include a pixel active layer positioned on the substrate and a pixel gate electrode positioned on the pixel active layer, and the circuit thin film transistor may include a circuit active layer formed on a same layer as the pixel active layer and a circuit gate electrode formed on a same layer as the pixel gate electrode.

The organic light emitting diode display may further include a first insulating layer positioned between the pixel thin film transistor and the first data wire.

The organic light emitting diode display may further include a second insulating layer positioned between the first data wire and the second data wire.

The common power supply line may be positioned on the second insulating layer, and the circuit unit may be covered by the second insulating layer.

The organic light emitting element may include: a first electrode positioned on the second insulating layer; an organic emission layer positioned on the first electrode; and a second electrode positioned on the organic emission layer.

The common power supply line may include a first sub-common power supply line formed on the same layer as the second data wire, and a second sub-common power supply line in contact with the first sub-common power supply line and formed on a same layer as the first electrode.

The common power supply line may be in direct contact with the second electrode.

The first electrode and the second data wire may be in contact with the second insulating layer.

The organic light emitting diode display may further include a third insulating layer positioned between the second data wire and the first electrode.

The common power supply line may include a same material as the second data wire.

The common power supply line is formed by a same process as the second data wire.

According to an aspect of exemplary embodiments, an organic light emitting diode display with a minimized or reduced width of a non-display area is provided.

According to another aspect of exemplary embodiments, an organic light emitting diode display with suppressed internal contamination is provided.

DESCRIPTION OF SYMBOLS

Figure 1:
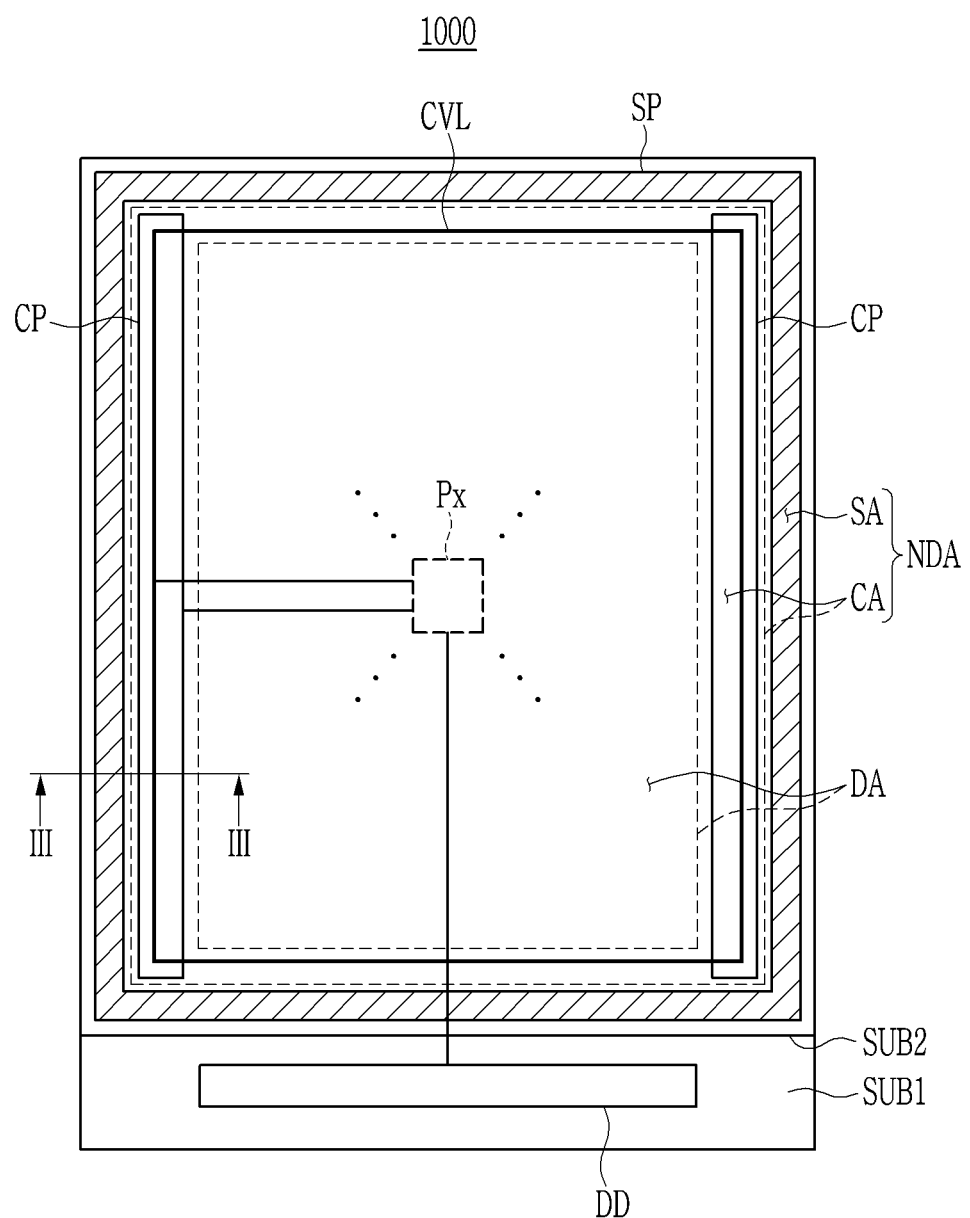
FIG. 1 is a top plan view showing an organic light emitting diode display according to an exemplary embodiment.

PTFT1: first pixel thin film transistor DW1: first data wire
DW2: second data wire OLED: organic light emitting element
CTFT1: first circuit thin film transistor CP: circuit unit
CVL: common power supply line

DETAILED DESCRIPTION

The present invention will be described more fully hereinafter with reference to the accompanying drawings, in which some exemplary embodiments of the invention are shown. As those skilled in the art would realize, the described embodiments may be modified in various different ways, all without departing from the spirit or scope of the present invention.

In order to more clearly explain the present invention, portions that are not directly related to the present invention may be omitted, and the same reference numerals are used in connection with the same or similar constituent elements throughout the specification.

In addition, the size and thickness of each configuration shown in the drawings may be arbitrarily shown for better understanding and ease of description, but the present invention is not limited thereto. In the drawings, the thicknesses of layers, films, panels, regions, etc., may be exaggerated for clarity. In the drawings, for better understanding and ease of description, the thicknesses of some layers and areas may be exaggerated.

It is to be understood that when an element such as a layer, film, region, or substrate is referred to as being "on" another element, it may be directly on the other element or one or more intervening elements may also be present. In contrast, when an element is referred to as being "directly on" another element, there are no intervening elements present. Further, in the specification, the words "on" or "above" mean positioned on or below the object portion, and do not necessarily mean positioned on the upper side of the object portion based on a gravitational direction.

In addition, unless explicitly described to the contrary, the word "comprise" and variations such as "comprises" or "comprising" will be understood to imply the inclusion of stated elements, but not the exclusion of any other elements.

Next, an organic light emitting diode display according to an exemplary embodiment will be described with reference to FIG. 1 to FIG. 3.

FIG. 1 is a top plan view showing an organic light emitting diode display according to an exemplary embodiment.

Referring to FIG. 1, an organic light emitting diode display 1000 according to an exemplary embodiment includes a first substrate SUB1, a second substrate SUB2, a pixel Px, a circuit unit CP, a common power supply line CVL, a sealing part SP, and a driving unit DD.

In an embodiment, the first substrate SUB1 and the second substrate SUB2 include at least one among glass, quartz, ceramic, sapphire, plastic, etc. The first substrate SUB1 and the second substrate SUB2 may be rigid, flexible, stretchable, rollable, or foldable.

The first substrate SUB1 includes a display area DA for displaying an image and a non-display area NDA neighboring the display area DA. In an embodiment, the non-display area NDA encloses the display area DA; however, the present invention is not limited thereto.

The non-display area NDA includes a circuit area CA to which the display area DA is adjacent and in which the circuit unit CP and the common power supply line CVL are positioned, and a sealing area SA in which the sealing part SP is positioned is adjacent to the circuit area CA. The circuit area CA is positioned between the display area DA and the sealing area SA.

The pixel Px is positioned in the display area DA of the first substrate SUB1. The pixel Px may be a minimum unit displaying an image. The pixel Px is electrically connected to the circuit unit CP, the driving unit DD, and the common power supply line CVL. The pixel Px may display the image by receiving a scan signal from the circuit unit CP, a data signal from the driving unit DD, and a common power supply from the common power supply line CVL.

In an embodiment, the pixel Px is electrically connected to a driving power supply line ELVDDL, thereby further receiving a driving power supply from the driving power supply line ELVDDL. For example, the driving power supply line ELVDDL may be positioned in at least one of the display area DA and the non-display area NDA of the first substrate SUB1.

Figure 2:
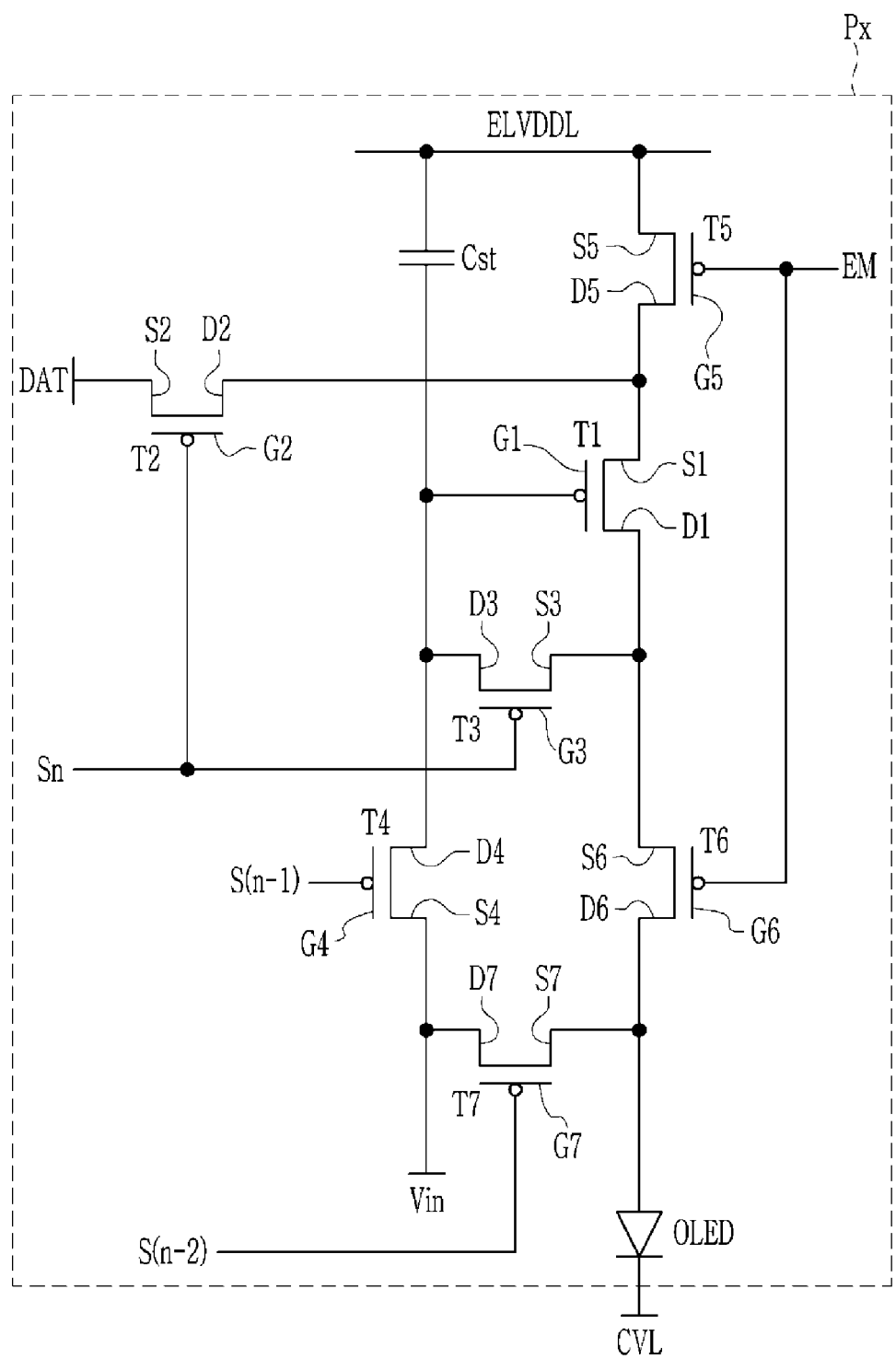
FIG. 2 is a circuit diagram showing a pixel shown in FIG. 1.

FIG. 2 is a circuit diagram showing a pixel of FIG. 1.

Referring to FIG. 2, the pixel Px includes a plurality of pixel thin film transistors T1, T2, T3, T4, T5, T6, and T7, a plurality of wires Sn, S(n-1), S(n-2), EM, Vin, DAT, and ELVDDL that are selectively electrically connected to the plurality of pixel thin film transistors T1, T2, T3, T4, T5, T6, and T7, as well as a pixel capacitor Cst and an organic light emitting element OLED.

The plurality of pixel thin film transistors T1, T2, T3, T4, T5, T6, and T7 includes a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is respectively electrically connected to a third drain electrode D3 of the third thin film transistor T3 and a fourth drain electrode D4 of the fourth thin film transistor T4, a first source electrode S1 thereof is respectively electrically connected to a second drain electrode D2 of the second thin film transistor T2 and a fifth drain electrode D5 of the fifth thin film transistor T5, and a first drain electrode D1 thereof is respectively electrically connected to a third source electrode S3 of the third thin film transistor T3 and a sixth source electrode S6 of the sixth thin film transistor T6.

A second gate electrode G2 of the second thin film transistor T2 is electrically connected to a first scan line Sn, a second source electrode S2 thereof is electrically connected to a data line DAT, and a second drain electrode D2 thereof is electrically connected to the first source electrode S1 of the first thin film transistor T1.

A third gate electrode G3 of the third thin film transistor T3 is electrically connected to the first scan line Sn, a third source electrode S3 thereof is electrically connected to the first drain electrode D1 of the first thin film transistor T1, and a third drain electrode D3 thereof is electrically connected to the first gate electrode G1 of the first thin film transistor T1.

A fourth gate electrode G4 of the fourth thin film transistor T4 is electrically connected to a second scan line S(n-1), a fourth source electrode S4 thereof is electrically connected to an initialization power supply line Vin, and a fourth drain electrode D4 thereof is electrically connected to the first gate electrode G1 of the first thin film transistor T1.

A fifth gate electrode G5 of the fifth thin film transistor T5 is electrically connected to a emission control line EM, a fifth source electrode S5 thereof is electrically connected to the driving power supply line ELVDDL, and a fifth drain electrode D5 thereof is electrically connected to the first source electrode S1 of the first thin film transistor T1.

A sixth gate electrode G6 of the sixth thin film transistor T6 is electrically connected to the emission control line EM, a sixth source electrode S6 thereof is electrically connected to the first drain electrode D1 of the first thin film transistor T1, and a first drain electrode D6 thereof is electrically connected to a seventh source electrode S7 of the seventh thin film transistor T7.

A seventh gate electrode G7 of the seventh thin film transistor T7 is electrically connected to a third scan line S(n-2), the seventh source electrode S7 thereof is electrically connected to the organic light emitting element OLED, and a seventh drain electrode D7 thereof is electrically connected to the fourth source electrode S4 of the fourth thin film transistor T4.

The plurality of wires includes the first scan line Sn transmitting a first scan signal to each of the second gate electrode G2 of the second thin film transistor T2 and the third gate electrode G3 of the third thin film transistor T3, the second scan line S(n-1) transmitting a second scan signal to the fourth gate electrode G4 of the fourth thin film transistor T4, the third scan line S(n-2) transmitting a third scan signal to the seventh gate electrode G7 of the seventh thin film transistor T7, the emission control line EM transmitting an emission control signal to each of the fifth gate electrode G5 of the fifth thin film transistor T5 and the sixth gate electrode G6 of the sixth thin film transistor T6, the data line DAT transmitting a data signal to the second source electrode S2 of the second thin film transistor T2, the driving power supply line ELVDDL supplying the driving power supply to each of one electrode of the pixel capacitor Cst and the fifth source electrode S5 of the fifth thin film transistor T5, and the initialization power supply line Vin supplying an initialization signal to the fourth source electrode S4 of the fourth thin film transistor T4.

The pixel capacitor Cst includes one electrode electrically connected to the driving power supply line ELVDDL and the other electrode that is electrically connected to each of the first gate electrode G1 of the first thin film transistor T1 and the third drain electrode D3 of the third thin film transistor T3.

The organic light emitting element OLED includes a first electrode, a second electrode positioned on the first electrode, and an organic emission layer positioned between the first electrode and the second electrode. The first electrode of the organic light emitting element OLED is respectively electrically connected to each of the seventh source electrode S7 of the seventh thin film transistor T7 and the sixth drain electrode D6 of the sixth thin film transistor T6, and the second electrode is electrically connected to the common power supply line CVL to which the common power supply is supplied.

The first scan line Sn, the second scan line S(n-1), the third scan line S(n-2), the emission control line EM, and the initialization power supply line Vin may be electrically connected to the circuit unit CP shown in FIG. 1. The data line DAT may be electrically connected to the driving unit DD shown in FIG. 1. The driving power supply line ELVDDL and the common power supply line CVL may be electrically connected to a terminal that is electrically connected to an external printed circuit board (PCB).

The pixel Px of the organic light emitting diode display 1000 according to an exemplary embodiment is configured of the plurality of pixel thin film transistors including the first thin film transistor T1 to the seventh thin film transistor T7, the pixel capacitor Cst, the first scan line Sn to the third scan line S(n-2), the data line DAT, the driving power supply line ELVDDL, and the initialization power supply line Vin; however, the present invention is not limited thereto, and the pixel of the organic light emitting diode display according to another exemplary embodiment may be configured of at least two pixel thin film transistors, at least one pixel capacitor, and wires including at least one scan line and at least one driving power supply line.

Referring to FIG. 1, the circuit unit CP is positioned in the circuit area CA of the non-display area NDA of the first substrate SUB1. In an embodiment, the circuit unit CP includes two circuit units CP separated from each other by the display area DA of the first substrate SUB1; however, the present invention is not limited thereto, and one circuit unit CP or at least three circuit units CP may be included.

The circuit unit CP includes at least one circuit thin film transistor and at least one circuit capacitor. The circuit unit CP is electrically connected to the pixel Px. The circuit unit CP may be electrically connected to the first scan line Sn, the second scan line S(n-1), the third scan line S(n-2), the emission control line EM, and the initialization power supply line Vin of the pixel Px shown in FIG. 2.

The common power supply line CVL is positioned on the circuit area CA of the non-display area NDA of the first substrate SUB1. The common power supply line CVL overlaps the circuit unit CP. The common power supply line CVL is positioned on the circuit unit CP. The common power supply line CVL is electrically connected to the second electrode of the organic light emitting element of the pixel Px.

The sealing part SP is positioned in the sealing area SA of the non-display area NDA of the first substrate SUB1. The sealing part SP encloses the display area DA of the first substrate SUB1. The sealing part SP is positioned between the first substrate SUB1 and the second substrate SUB2 and adheres the first substrate SUB1 and the second substrate SUB2. In an embodiment, the sealing part SP includes a frit; however, the present invention is not limited thereto, and various organic materials or inorganic materials capable of adhering the first substrate SUB1 and the second substrate SUB2 may be included.

The driving unit DD is positioned in the non-display area NDA of the first substrate SUB1. In an embodiment, the driving unit DD may be an integrated circuit chip (IC chip) connected to the first substrate SUB1; however, the present invention is not limited thereto. The driving unit DD may be electrically connected to the data line DAT of the pixel Px shown in FIG. 2.

Next, a stacking order of the organic light emitting diode display 1000 according to an exemplary embodiment will be described with reference to FIG. 3.

Figure 3:
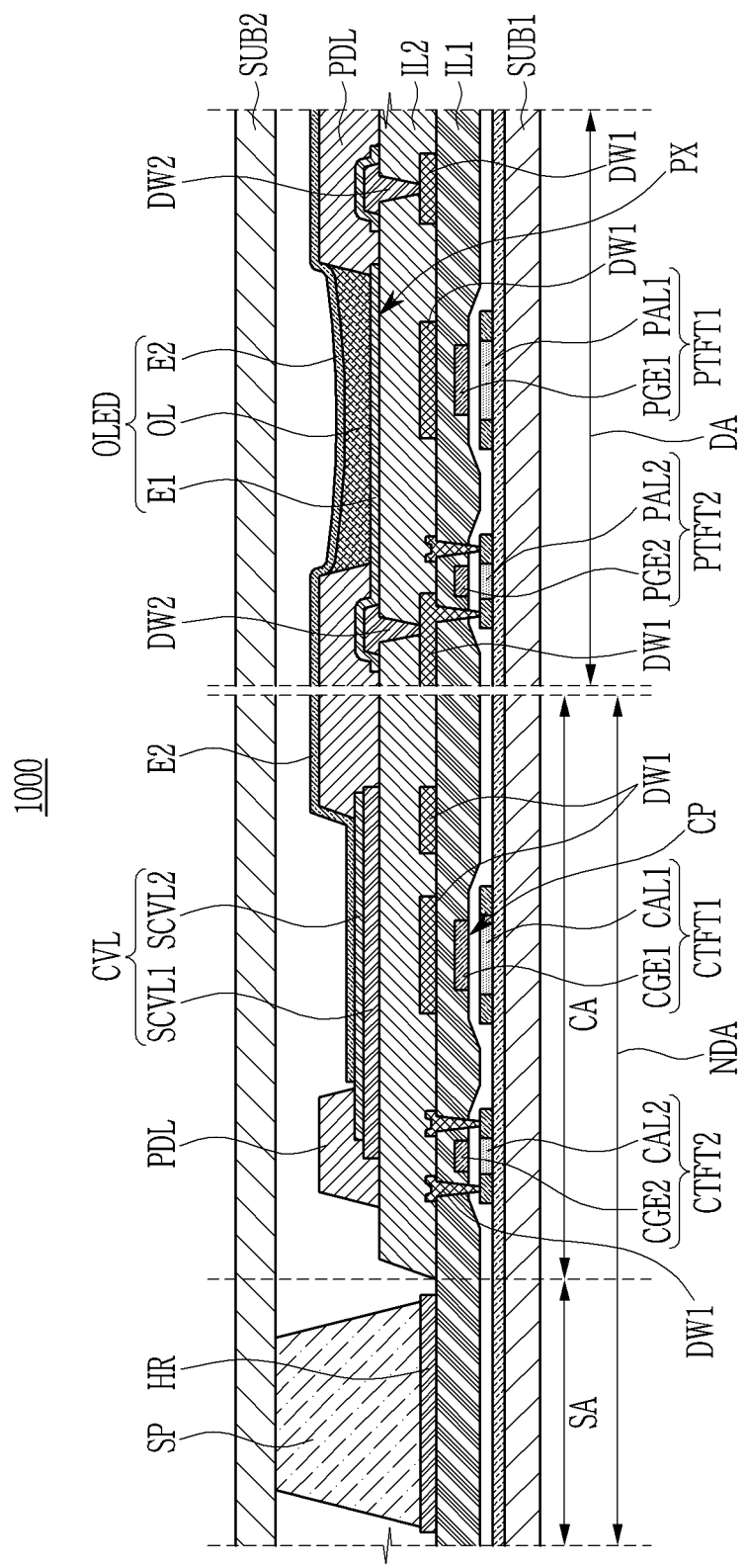
FIG. 3 is a cross-sectional view taken along the line III-III of FIG. 1.

FIG. 3 is a cross-sectional view taken along the line III-III of FIG. 1.

Referring to FIG. 3, the organic light emitting diode display 1000 according to an exemplary embodiment includes the first substrate SUB1, the second substrate SUB2, the pixel Px, a first insulating layer IL1, a second insulating layer IL2, a pixel definition layer PDL, the circuit unit CP, the common power supply line CVL, the sealing part SP, and a heat reflection part HR.

The first substrate SUB1 includes the display area DA, and the non-display area NDA including the circuit area CA and the sealing area SA. The pixel Px, the circuit unit CP, the common power supply line CVL, the sealing part SP, and the heat reflection part HR are positioned between the first substrate SUB1 and the second substrate SUB2.

The pixel Px is positioned in the display area DA of the first substrate SUB1, and includes a first pixel thin film transistor PTFT1, a second pixel thin film transistor PTFT2, a first data wire DW1, a second data wire DW2, and the organic light emitting element OLED.

The first pixel thin film transistor PTFT1 is positioned in the display area DA of the first substrate SUB1. The first pixel thin film transistor PTFT1 includes a first pixel active layer PAL1 positioned on a first substrate SUB1 and a first pixel gate electrode PGE1 positioned on the first pixel active layer PAL1. The first pixel active layer PAL1 includes a channel region overlapping with the first pixel gate electrode PGE1, and a source electrode and a drain electrode that do not overlap with the first pixel gate electrode PGE1.

The second pixel thin film transistor PTFT2 is positioned in the display area DA of the first substrate SUB1. The second pixel thin film transistor PTFT2 includes a second pixel active layer PAL2 positioned on the first substrate SUB1 and a second pixel gate electrode PGE2 positioned on the second pixel active layer PAL2. The second pixel active layer PAL2 includes a channel region overlapping with the second pixel gate electrode PGE2, and a source electrode and a drain electrode that do not overlap with the second pixel gate electrode PGE2.

Each of the first pixel thin film transistor PTFT1 and the second pixel thin film transistor PTFT2 may be one among the first thin film transistor T1 to the seventh thin film transistor T7 of the pixel Px shown in FIG. 2.

The first data wire DW1 is positioned on the first pixel thin film transistor PTFT1 and the second pixel thin film transistor PTFT2. The first insulating layer IL1 is positioned between the first data wire DW1 and the first pixel thin film transistor PTFT1 and between the first data wire DW1 and the second pixel thin film transistor PTFT2.

The first data wire DW1 may include at least one line among the first scan line Sn of the pixel Px shown in FIG. 2, the second scan line S(n-1), the third scan line S(n-2), the emission control line EM, the initialization power supply line Vin, the data line DAT, and the driving power supply line ELVDDL.

The second data wire DW2 is positioned on the first data wire DW1. The second insulating layer IL2 is positioned between the second data wire DW2 and the first data wire DW1.

The second data wire DW2 is in contact with the first data wire DW1 through a contact hole formed in the second insulating layer IL2. In an embodiment, the second data wire DW2 may include a different material from the first data wire DW1; however, the present invention is not limited thereto, and the same material as the first data wire DW1 may be included.

The second data wire DW2 may include at least one line among the first scan line Sn of the pixel Px shown in FIG. 2, the second scan line S(n-1), the third scan line S(n-2), the emission control line EM, the initialization power supply line Vin, the data line DAT, and the driving power supply line ELVDDL.

The organic light emitting element OLED is positioned on the second data wire DW2 and is electrically connected to the second pixel thin film transistor PTFT2 through the first data wire DW1 and the second data wire DW2.

The organic light emitting element OLED includes a first electrode E1 positioned on the second insulating layer IL2, an organic emission layer OL positioned on the first electrode E1, and a second electrode E2 positioned on the organic emission layer OL.

At least one electrode of the first electrode E1 and the second electrode E2 may be one among a light transmitting electrode, a light reflective electrode, and a light translucent electrode. The light emitted from the organic emission layer OL may be emitted in at least one electrode direction of the first electrode E1 and the second electrode E2.

The first electrode E1 is electrically connected to the second pixel thin film transistor PTFT2 through the second data wire DW2 and the first data wire DW1.

The first electrode E1 and the second data wire DW2 are in contact with the second insulating layer IL2.

The first electrode E1 is partially exposed by the pixel definition layer PDL. An opening of the pixel definition layer PDL overlaps at least part of the first electrode E1.

The second electrode E2 extends from the display area DA to the non-display area NDA of the first substrate SUB1. The second electrode E2 is in direct contact with the common power supply line CVL in the non-display area NDA.

In an embodiment, a capping layer covering the organic light emitting element OLED may be positioned on the organic light emitting element OLED, and the second substrate SUB2 is positioned on the organic light emitting element OLED via the capping layer. In an embodiment, a thin film encapsulation layer may be positioned on the organic light emitting element OLED.

The first insulating layer IL1 is positioned between the first pixel gate electrode PGE1 and the first data wire DW1 of the first pixel thin film transistor PTFT1.

The second insulating layer IL2 is positioned between the first data wire DW1 and the second data wire DW2.

In an embodiment, the first insulating layer IL1 and the second insulating layer IL2 may include an inorganic insulating layer including at least one of a silicon nitride and a silicon oxide, or an organic insulating layer. The first insulating layer IL1 and the second insulating layer IL2 may be formed of a single layer or of multiple layers.

The pixel definition layer PDL may include the opening exposing at least part of the first electrode E1 of the organic light emitting element OLED, and may enclose the edge of the first electrode E1.

The circuit unit CP is positioned in the circuit area CA of the non-display area NDA of the first substrate SUB1, and includes a first circuit thin film transistor CTFT1, a second circuit thin film transistor CTFT2, and a first data wire DW1.

The first circuit thin film transistor CTFT1 is positioned in the circuit area CA of the first substrate SUB1. The first circuit thin film transistor CTFT1 includes a first circuit active layer CAL1 positioned on the first substrate SUB1 and a first circuit gate electrode CGE1 positioned on the first circuit active layer CAL1. The first circuit active layer CAL1 includes a channel region overlapping with the first circuit gate electrode CGE1, and a source electrode and a drain electrode that do not overlap with the first circuit gate electrode CGE1.

The second circuit thin film transistor CTFT2 is positioned in the circuit area CA of the first substrate SUB1. The second circuit thin film transistor CTFT2 includes a second circuit active layer CAL2 positioned on the first substrate SUB1 and a second circuit gate electrode CGE2 positioned on the second circuit active layer CAL2. The second circuit active layer CAL2 includes a channel region overlapping with the second circuit gate electrode CGE2, and a source electrode and a drain electrode that do not overlap with the second circuit gate electrode CGE2.

In an embodiment, the first circuit active layer CAL1 and the second circuit active layer CAL2 are formed on a same layer as the first pixel active layer PAL1 and the second pixel active layer PAL2. In an embodiment, the first circuit gate electrode CGE1 and the second circuit gate electrode CGE2 are formed on a same layer as the first pixel gate electrode PGE1 and the second pixel gate electrode PGE2.

The first circuit thin film transistor CTFT1 and the second circuit thin film transistor CTFT2 may be a part among the plurality of circuit thin film transistors included in the circuit unit CP. The first circuit thin film transistor CTFT1 and the second circuit thin film transistor CTFT2 are electrically connected to the first pixel thin film transistor PTFT1 and the second pixel thin film transistor PTFT2, which are positioned in the display area DA.

The first data wire DW1 is positioned on the first circuit thin film transistor CTFT1 and the second circuit thin film transistor CTFT2. The first insulating layer IL1 is positioned between the first data wire DW1 and the first circuit thin film transistor CTFT1 and between the first data wire DW1 and the second circuit thin film transistor CTFT2.

The plurality of circuit thin film transistors included in the circuit unit CP and the first data wire DW1 may have any of various disclosed circuit structures.

The common power supply line CVL is positioned on the circuit unit CP in the circuit area CA. The common power supply line CVL overlaps the circuit unit CP. The common power supply line CVL is electrically connected to the organic light emitting element OLED, and is in direct contact with the second electrode E2 of the organic light emitting element OLED.

In an embodiment, the common power supply line CVL is formed on a same layer as the second data wire DW2 positioned in the display area DA. In an embodiment, the common power supply line CVL includes a same material as the second data wire DW2. In an embodiment, the common power supply line CVL may be concurrently (e.g., simultaneously) formed with the second data wire DW2 by a process forming the second data wire DW2.

The second insulating layer IL2 is positioned between the common power supply line CVL and the first data wire DW1 of the circuit unit CP. The common power supply line CVL is positioned on the second insulating layer IL2, and the circuit unit CP is covered by the second insulating layer IL2.

In an embodiment, the common power supply line CVL includes a first sub-common power supply line SCVL1 and a second sub-common power supply line SCVL2.

In an embodiment, the first sub-common power supply line SCVL1 is formed on a same layer as the second data wire DW2 and includes a same material as the second data wire DW2.

The second sub-common power supply line SCVL2 is positioned on the first sub-common power supply line SCVL1 and is in direct contact with the first sub-common power supply line SCVL1. The second sub-common power supply line SCVL2 is positioned between the first sub-common power supply line SCVL1 and the second electrode E2 of the organic light emitting element OLED, and is in direct contact with the first sub-common power supply line SCVL1 and the second electrode E2. In an embodiment, the second sub-common power supply line SCVL2 may be formed on a same layer as the first electrode E1 of the organic light emitting element OLED, and may include a same material as the first electrode E1.

The sealing part SP is positioned in the sealing area SA of the non-display area NDA of the first substrate SUB1. The sealing part SP adheres the first substrate SUB1 and the second substrate SUB2, and is positioned between the first insulating layer IL1 and the second substrate SUB2. In an embodiment, the sealing part SP includes the frit, and is heated by a laser beam to adhere the first substrate SUB1 and the second substrate SUB2.

The heat reflection part HR is positioned between the sealing part SP and the first substrate SUB1. The heat reflection part HR is positioned between the first insulating layer IL1 and the sealing part SP, and is in direct contact with the sealing part SP and the first insulating layer IL1.

In an embodiment, the heat reflection part HR is formed on a same layer as the first data wire DW1 and includes a same material as the second data wire DW2. In an embodiment, the heat reflection part HR is concurrently (e.g., simultaneously) formed with the second data wire DW2 by a process forming the second data wire DW2.

The heat reflection part HR is not in contact with the common power supply line CVL or the circuit unit CP. In an embodiment, the heat reflection part HR has an island shape.

When heating the sealing part SP by using the heat of the laser beam, the heat reflection part HR again reflects the heat passing the sealing part SP toward the sealing part SP direction, thereby helping the sealing part SP to be easily heated.

As described above, in the organic light emitting diode display 1000 according to an exemplary embodiment, the common power supply line CVL is positioned on the same layer as the second data wire DW2 to overlap the circuit unit CP on the circuit unit CP of the circuit area CA, thereof minimizing or reducing a plane width of the circuit area CA.

That is, the organic light emitting diode display 1000 with a minimized or reduced width of the non-display area NDA is provided.

Also, in the organic light emitting diode display 1000 according to an exemplary embodiment, the common power supply line CVL includes the first sub-common power supply line SCVL1 positioned on the same layer as the second data wire DW2 and the second sub-common power supply line SCVL2 positioned on the same layer as the first electrode E1, thereby minimizing or reducing electrical resistance of the common power supply line CVL. Accordingly, the organic light emitting diode display 1000 suppressing the drop of the voltage of the common power supply passing through the second electrode E2 from the common power supply line CVL due to the electrical resistance is provided.

Also, in the organic light emitting diode display 1000 according to an exemplary embodiment, as the heat reflection part HR in contact with the sealing part SP includes the same material as the second data wire DW2 and is not in contact with the common power supply line CVL or the circuit unit CP, when heating the sealing part SP by using the heat of the laser beam, the heat passing the sealing part SP is suppressed from being transmitted to the common power supply line CVL and the circuit unit CP through the heat reflection part HR. As above-described, as the heat transmitted from the sealing part SP to the heat reflection part HR by the laser beam used during the manufacturing process is suppressed from being transmitted to the common power supply line CVL and the circuit unit CP, degradation of the first insulating layer IL1, the second insulating layer IL2, and the pixel definition layer PDL disposed in the non-display area NDA due to the heat is suppressed, and because the gas generated from the first insulating layer IL1, the second insulating layer IL2, and the pixel definition layer PDL is suppressed from being generated, the inside of the organic light emitting diode display 1000 is suppressed from being contaminated due to the gas.

That is, the organic light emitting diode display 1000 with suppressed internal contamination is provided, As described above, the organic light emitting diode display 1000 with the minimized or reduced width of the non-display area NDA and also with the internal contamination being suppressed is provided.

Next, an organic light emitting diode display according to another exemplary embodiment will be described with reference to FIG. 4.

Differences from the previously described organic light emitting diode display according to an exemplary embodiment will be described.

Figure 4:
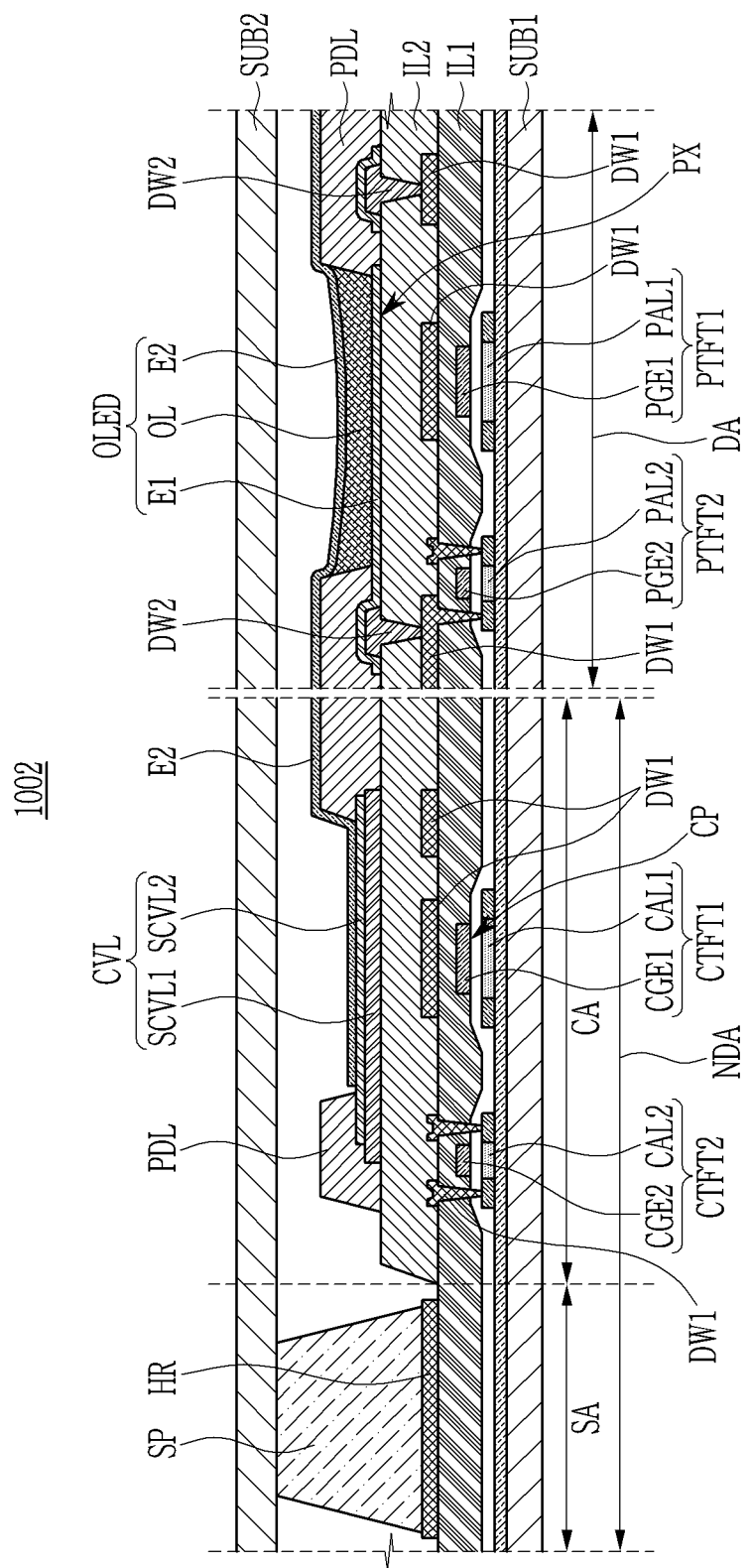
FIG. 4 is a cross-sectional view of an organic light emitting diode display according to another exemplary embodiment, taken along a line corresponding to the line III-III of FIG. 1.

FIG. 4 is a cross-sectional view of an organic light emitting diode display according to another exemplary embodiment, taken along a line corresponding to the line III-III of FIG. 1.

Referring to FIG. 4, an organic light emitting diode display 1002 according to another exemplary embodiment includes the first substrate SUB1, the second substrate SUB2, the pixel Px, the first insulating layer IL1, the second insulating layer IL2, the pixel definition layer PDL, the circuit unit CP, the common power supply line CVL, the sealing part SP, and the heat reflection part HR.

The heat reflection part HR is positioned between the sealing part SP and the first substrate SUB1. The heat reflection part HR is positioned between the first insulating layer IL1 and the sealing part SP, and is in direct contact with the sealing part SP and the first insulating layer IL1.

In an embodiment, the heat reflection part HR is formed on a same layer as the first data wire DW1 and includes a same material as the first data wire DW1. In an embodiment, the heat reflection part HR is concurrently (e.g., simultaneously) formed with the first data wire DW1 by a process forming the first data wire DW1.

The heat reflection part HR is not in contact with the common power supply line CVL or the circuit unit CP.

As described above, in the organic light emitting diode display 1002 according to another exemplary embodiment, the common power supply line CVL is positioned on the same layer as the second data wire DW2 to overlap the circuit unit CP on the circuit unit CP of the circuit area CA, thereby minimizing or reducing the plane width of the circuit area CA.

That is, the organic light emitting diode display 1002 with the minimized or reduced width of the non-display area NDA is provided.

Also, in the organic light emitting diode display 1002 according to another exemplary embodiment, the common power supply line CVL includes the first sub-common power supply line SCVL1 positioned on the same layer as the second data wire DW2 and the second sub-common power supply line SCVL2 positioned on the same layer as the first electrode E1, thereby minimizing or reducing the electrical resistance of the common power supply line CVL. Accordingly, the organic light emitting diode display 1002 in which the voltage of the common power supply passing the second electrode E2 from the common power supply line CVL is suppressed from being dropped by the electrical resistance is provided.

Also, in the organic light emitting diode display 1002 according to another exemplary embodiment, as the heat reflection part HR in contact with the sealing part SP includes the same material as the first data wire DW1 and is not in contact with the common power supply line CVL or the circuit unit CP, when heating the sealing part SP by using the heat of the laser beam, the heat passing the sealing part SP is suppressed from being transmitted to the common power supply line CVL and the circuit unit CP through the heat reflection part HR. As described above, as the heat transmitted from the sealing part SP to the heat reflection part HR by the laser beam used during the manufacturing process is suppressed from being transmitted to the common power supply line CVL and the circuit unit CP, the degradation of the first insulating layer IL1, the second insulating layer IL2, and the pixel definition layer PDL disposed in the non-display area NDA due to the heat is suppressed, and because the gas generated from first insulating layer IL1, the second insulating layer IL2, and the pixel definition layer PDL is suppressed from being generated, the inside of the organic light emitting diode display 1002 is suppressed from being contaminated due to the gas.

That is, the organic light emitting diode display 1002 with suppressed internal contamination is provided.

As described above, the organic light emitting diode display 1002 with the minimized or reduced width of the non-display area NDA and also with the internal contamination being suppressed is provided.

Next, an organic light emitting diode display according to another exemplary embodiment will be described with reference to FIG. 5.

Differences from the previously described organic light emitting diode display according to an exemplary embodiment will be described.

Figure 5:
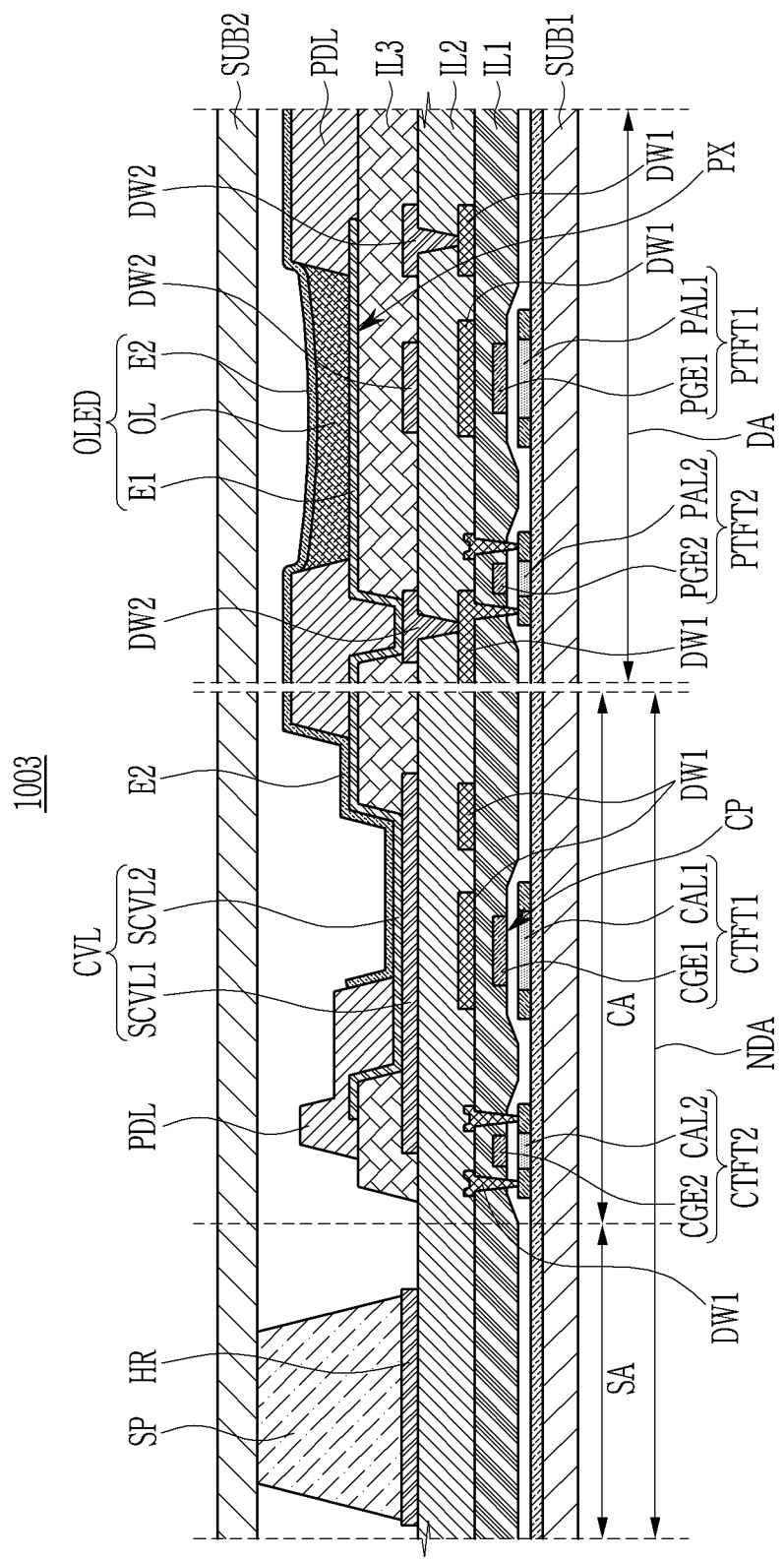
FIG. 5 is a cross-sectional view of an organic light emitting diode display according to another exemplary embodiment, taken along a line corresponding to the line III-III of FIG. 1.

FIG. 5 is a cross-sectional view of an organic light emitting diode display according to another exemplary embodiment, taken along a line corresponding to the line III-III of FIG. 1.

Referring to FIG. 5, an organic light emitting diode display 1003 according to another exemplary embodiment includes the first substrate SUB1, the second substrate SUB2, the pixel Px, the first insulating layer IL1, the second insulating layer IL2, a third insulating layer IL3, the pixel definition layer PDL, the circuit unit CP, the common power supply line CVL, the sealing part SP, and the heat reflection part HR.

The third insulating layer IL3 is positioned between the second data wire DW2 and the first electrode E1 of the organic light emitting element OLED.

In an embodiment, the third insulating layer IL3 may include an inorganic insulating layer including at least one of a silicon nitride and a silicon oxide, or an organic insulating layer. The third insulating layer IL3 may be formed of a single layer or multiple layers.

The first electrode E1 of the organic light emitting element OLED is in contact with the second data wire DW2 through a contact hole formed in the third insulating layer IL3. The second data wire DW2 is in contact with the second insulating layer IL2, and the first electrode E1 is not in contact with the second insulating layer IL2.

In an embodiment, the common power supply line CVL includes the first sub-common power supply line SCVL1 and the second sub-common power supply line SCVL2.

In an embodiment, the first sub-common power supply line SCVL1 is positioned on the same layer as the second data wire DW2, and includes the same material as the second data wire DW2.

The second sub-common power supply line SCVL2 is positioned on the first sub-common power supply line SCVL1. The second sub-common power supply line SCVL2 is in direct contact with the first sub-common power supply line SCVL1 through the contact hole formed in the third insulating layer IL3.

The sealing part SP is positioned in the sealing area SA of the non-display area NDA of the first substrate SUB1. The sealing part SP adheres the first substrate SUB1 and the second substrate SUB2, and is positioned between the second insulating layer IL2 and the second substrate SUB2. In an embodiment, the sealing part SP includes the frit, and is heated by a laser beam to adhere the first substrate SUB1 and the second substrate SUB2.

The heat reflection part HR is positioned between the sealing part SP and the first substrate SUB1. The heat reflection part HR is positioned between the second insulating layer IL2 and the sealing part SP, and is in direct contact with the sealing part SP and the second insulating layer IL2.

In an embodiment, the heat reflection part HR is positioned on the same layer as the second data wire DW2 and includes the same material as the second data wire DW2. In an embodiment, the heat reflection part HR is concurrently (e.g., simultaneously) formed with the second data wire DW2 by a process forming the second data wire DW2.

The heat reflection part HR is not in contact with the common power supply line CVL or the circuit unit CP.

As described above, in the organic light emitting diode display 1003 according to another exemplary embodiment, the common power supply line CVL is positioned on the same layer as the second data wire DW2 to overlap the circuit unit CP on the circuit unit CP of the circuit area CA, thereby minimizing or reducing the plane width of the circuit area CA.

That is, the organic light emitting diode display 1003 with the minimized or reduced width of the non-display area NDA is provided.

Also, in the organic light emitting diode display 1003 according to an exemplary embodiment, the common power supply line CVL includes the first sub-common power supply line SCVL1 positioned on the same layer as the second data wire DW2 and the second sub-common power supply line SCVL2 positioned on the same layer as the first electrode E1, thereby minimizing or reducing electrical resistance of the common power supply line CVL. Accordingly, the organic light emitting diode display 1003 with the drop of the voltage of the common supply passing through the second electrode E2 from the common power supply line CVL due to the electrical resistance being suppressed is provided.

Also, in the organic light emitting diode display 1003 according to another exemplary embodiment, the heat reflection part HR in contact with the sealing part SP includes the same material as the second data wire DW2 on the same layer as the second data wire DW2 and is not in contact with the common power supply line CVL or the circuit unit CP, and when heating the sealing part SP by using the heat of the laser beam, the heat passing the sealing part SP is suppressed from being transmitted to the common power supply line CVL and the circuit unit CP through the heat reflection part HR. As described above, as the heat transmitted from the sealing part SP to the heat reflection part HR by the laser beam used during the manufacturing process is suppressed from being transmitted to the common power supply line CVL and the circuit unit CP, degradation of the first insulating layer IL1, the second insulating layer IL2, and the pixel definition layer PDL disposed in the non-display area NDA due to the heat is suppressed, and because the gas generated from the first insulating layer IL1, the second insulating layer IL2, and the pixel definition layer PDL is suppressed from being generated, the inside of the organic light emitting diode display 1003 is suppressed from being contaminated due to the gas.

That is, the organic light emitting diode display 1003 with the suppressed internal contamination is provided.

According to an aspect, as described above, the organic light emitting diode display 1003 with the minimized or reduced width of the non-display area NDA and also with the suppressed internal contamination is provided.

While the present invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
    a substrate including a display area and a non-display area adjacent to the display area;
    a pixel thin film transistor positioned in the display area of the substrate;
    a first conductive layer positioned over the pixel thin film transistor;
    a second conductive layer positioned over the first conductive layer;
    an organic light emitting element positioned over the second conductive layer and electrically connected to the pixel thin film transistor through the first conductive layer and the second conductive layer;
    a circuit unit positioned in the non-display area of the substrate and including a circuit thin film transistor electrically connected to the pixel thin film transistor; and
    a common power supply line overlapping at least part of the circuit unit, electrically connected to the organic light emitting element, and formed on a same layer as the second conductive layer,
    wherein the first conductive layer is connected to the pixel thin film transistor and the second conductive layer,
    wherein the non-display area includes:
    a circuit area adjacent to the display area and including the circuit unit and the common power supply line; and
    a sealing area adjacent to the circuit area, the organic light emitting diode display further comprising a sealing part positioned in the sealing area and a heat reflection part in contact with the sealing part between the sealing part and the substrate,
    wherein the heat reflection part is isolated from the common power supply line or the circuit unit, and
    wherein the heat reflection part is positioned over the first conductive layer and on a same layer as the second conductive layer.

2. The organic light emitting diode display of claim 1, wherein the heat reflection part includes a same material as the second conductive layer.

3. The organic light emitting diode display of claim 1, wherein the heat reflection part has an island shape.

4. The organic light emitting diode display of claim 1, wherein
  the pixel thin film transistor includes:
  a pixel active layer positioned on the substrate; and
  a pixel gate electrode positioned on the pixel active layer, and
  the circuit thin film transistor includes:
  a circuit active layer formed on a same layer as the pixel active layer; and
  a circuit gate electrode formed on a same layer as the pixel gate electrode.

5. The organic light emitting diode display of claim 1, further comprising a first insulating layer positioned between the pixel thin film transistor and the first conductive layer.

6. The organic light emitting diode display of claim 5, further comprising a second insulating layer positioned between the first conductive layer and the second conductive layer.

7. The organic light emitting diode display of claim 6, wherein
  the common power supply line is positioned on the second insulating layer, and
  the circuit unit is covered by the second insulating layer.

8. The organic light emitting diode display of claim 6, wherein the organic light emitting element includes:
  a first electrode positioned on the second insulating layer;
  an organic emission layer positioned on the first electrode; and
  a second electrode positioned on the organic emission layer.

9. The organic light emitting diode display of claim 8, wherein the common power supply line includes:
  a first sub-common power supply line formed on the same layer as the second conductive layer; and
  a second sub-common power supply line in contact with the first sub-common power supply line and formed on a same layer as the first electrode.

10. The organic light emitting diode display of claim 8, wherein the common power supply line is in direct contact with the second electrode.

11. The organic light emitting diode display of claim 8, wherein the first electrode and the second conductive layer are in contact with the second insulating layer.

12. The organic light emitting diode display of claim 8, further comprising a third insulating layer positioned between the second conductive layer and the first electrode.

13. The organic light emitting diode display of claim 1, wherein the common power supply line includes a same material as the second conductive layer.

14. The organic light emitting diode display of claim 13, wherein the common power supply line is formed by a same process as the second conductive layer.

\* \* \* \* \*